US006830943B1

(12) United States Patent
Lo et al.

(10) Patent No.: US 6,830,943 B1
(45) Date of Patent: Dec. 14, 2004

(54) THIN FILM CMOS CALIBRATION STANDARD HAVING PROTECTIVE COVER LAYER

(75) Inventors: Wai Lo, Lake Oswego, OR (US); David Chan, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/702,165

(22) Filed: Nov. 4, 2003

Related U.S. Application Data

(62) Division of application No. 10/194,578, filed on Jul. 12, 2002, now Pat. No. 6,674,092.

(51) Int. Cl.[7] .............................................. H01L 21/66
(52) U.S. Cl. .............................. 438/18; 438/17; 438/14; 438/778
(58) Field of Search ............................... 438/11, 14, 15, 438/18, 17, 778, 787

(56) References Cited

U.S. PATENT DOCUMENTS

| 6,710,889 B2 | * | 3/2004 | Lee et al. .................... 356/630 |
| 2003/0058437 A1 | * | 3/2003 | Tortonese et al. ......... 356/243.4 |

* cited by examiner

*Primary Examiner*—Michael S. Lebentritt
*Assistant Examiner*—Brad Smith
(74) *Attorney, Agent, or Firm*—Beyer Weaver & Thomas, LLP

(57) ABSTRACT

Embodiments of the invention include a calibration standard for semiconductor metrology tools. The standard comprises a substrate having a surface with a calibration layer formed thereon. A protective layer is formed over the underlying calibration layer. The calibration layer and protective layer are each formed to precise tolerances. The invention also includes methods for forming a calibration standard for semiconductor metrology tools.

13 Claims, 1 Drawing Sheet

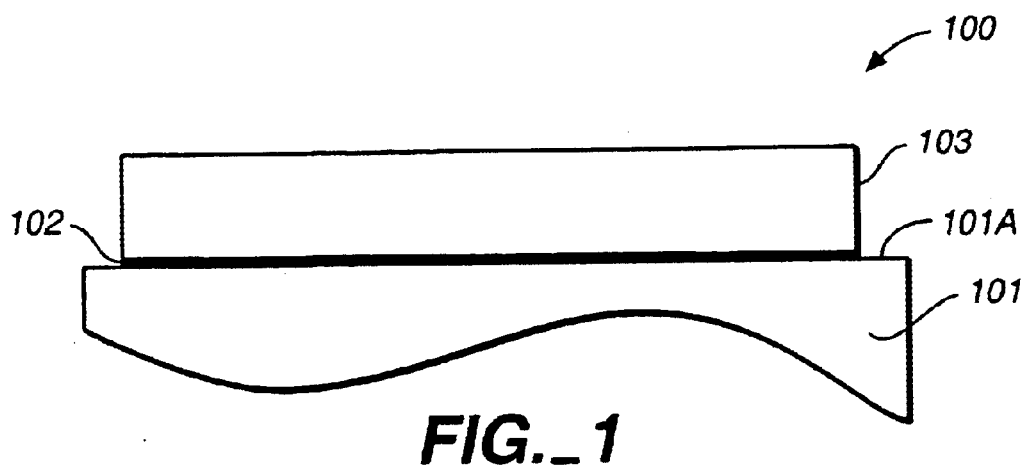
FIG._1
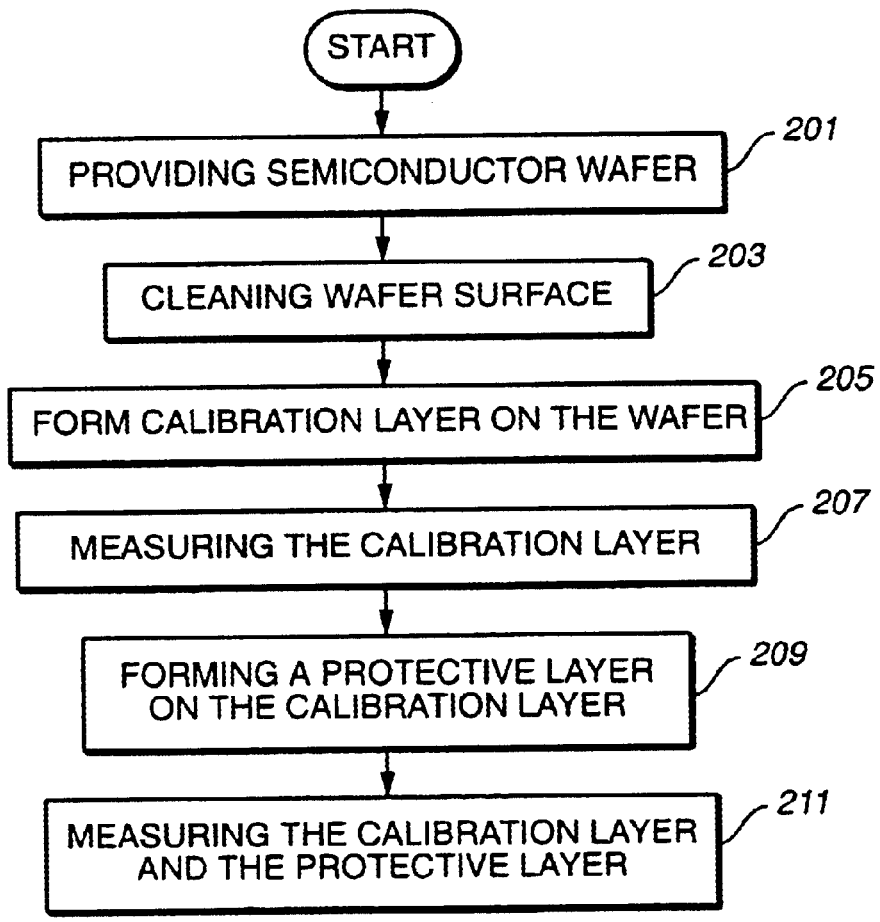
FIG._2

THIN FILM CMOS CALIBRATION STANDARD HAVING PROTECTIVE COVER LAYER

RELATED APPLICATIONS

This application is a divisional application claiming priority from the U.S. patent application Ser. No. 10/194,578, entitled "Thin Film CMOS Calibration Standard Having Protective Cover Layer", filed on Jul. 12, 2002, now U.S. Pat. No. 6,674,092 invented by Lo, W. et al. The aforementioned patent application is hereby incorporated by reference.

TECHNICAL FIELD

The invention described herein relates generally to semiconductor metrology. In particular, the invention relates to methods and standards used for the measurement of very thin gate layers for CMOS devices.

BACKGROUND

Gate dielectric layers (commonly comprised of silicon dioxide and silicon oxynitride materials) are critical components in complementary metal oxide semiconductor (CMOS) devices. As the size and critical dimension of the CMOS devices continues to shrink, the thickness of the gate dielectric layers grows ever thinner. For example, when the length of the gate electrode is on the order of 90 nanometers (nm), the gate layer thicknesses are on the order of about 15 Å thick. In the near future, such gate layers are projected to be 10 Å thick and less. Such thin gate layers pose a number of challenges. Apart from process difficulties, such thin layers challenge the capabilities of metrology tools and standards upon which they are based.

Without reliable calibration standards, it is not possible to have sufficient confidence in the accuracy of semiconductor metrology tools (e.g., X-ray, reflectometers, spectroscopic ellipsometers, discrete wavelength ellipsometers, and the like). Without accurate and reliable measurements and calibration "standards", semiconductor fabrication is significantly hampered.

"Standards" are simulated semiconductor structures having dimensions similar to those of actual fabricated semiconductor devices. The standards are used to reliably and repeatably calibrate a variety of metrology tools. In turn, the calibrated metrology tools are used to the measure aspects of actual semiconductor devices to determine if they meet with manufacturer specifications.

In order to function effectively as a calibration standard for a semiconductor gate layer, the standard must meet with the following requirements:

(a) be stable against time and temperature;

(b) have a thickness close to that of the desired gate thickness;

(c) be fabricated to a very small tolerance (i.e., having high fabrication reproducibility); and (d) be useable to calibrate a wide variety of metrology tools.

Existing standards include National Institute of Standards and Technology (NIST) traceable silicon dioxide ($SiO_2$) wafers. Also used are $SiO_2$ layers grown on Si wafers. Although these standards are suitable for many applications, they do not accommodate the needs of measuring ultra-thin film layers. For purposes of this patent, ultra-thin layers shall be defined as layers being less than about 50 Å thick, especially those layers on the order of about 5–30 Å thick.

NIST traceable $SiO_2$ wafers have $SiO_2$ layers in excess of 100 Å thick. Such thicknesses make them inapplicable as standards for measurements of ultra-thin films. This is especially so when there is a need to measure gate layers having thicknesses on the order of about 5–30 Å thick. Also, the tolerances in the NIST wafers are on the order of 5–10%. This leads to a variation of at least ±5 Å in the $SiO_2$ layers. Such variation is drastic in the context of a 5–30 Å thick gate layer. Additionally, the International Technology Roadmap of Semiconductors (ITRS) has provided guidelines for semiconductor fabrication. These guidelines specify that the statistical control limit for variation in gate layer thickness is ±4% of the gate layer thickness. Thus, the existing standards are inadequate for the needs of coming generations of semiconductor devices.

An additional problem is that the $SiO_2$ layers of NIST traceable $SiO_2$ wafers are vulnerable to environmental conditions. Even in highly controlled clean-room environments, the $SiO_2$ layers absorb molecular airborne contaminants (MAC). Such absorption causes significant changes in the thickness of the $SiO_2$ layers. For example, in a clean-room environment, exposure of NIST traceable $SiO_2$ wafers to the clean room atmosphere for time periods as short as one hour cause the $SiO_2$ layer to increase in thickness as much as 0.4 Å. For thicknesses greater than 100 Å, such changes are well within the ITRS guideline and not generally considered significant. However, for ultra-thin films, even this small degree of degradation poses problems. Moreover, such film layer degradation becomes even more significant over time. For example, the $SiO_2$ layer of the standard can thicken as much as 1.6 Å in a three-month period. Over a nine-month period, the $SiO_2$ layer of the standard can thicken as much as 3.0 Å. Thus, such a standard would be completely useless as a standard for ultra-thin gate layers (especially for extremely thin 5 Å layers). As a result, such NIST traceable $SiO_2$ wafers do not meet requirements (a), (b), and (c) above.

Standards using $SiO_2$ layers grown onto Si wafers also have drawbacks. Although such $SiO_2$ layers can be grown quite thin, they require extensive fabrication expertise. Additionally, such standards are also vulnerable to environmental conditions and MAC's. As with the NIST standards discussed above, even in highly controlled clean-room environments, the $SiO_2$ layers absorb MAC's which de grade and thicken their surfaces. Thus, as with NIST standards, they do not meet criteria (a).

What is needed is a standard that is stable over time and under a variety of environmental conditions, has a thickness close to that of the desired gate thickness, can be fabricated to a very small tolerance, have high fabrication reproducibility, and be useable with a wide variety of metrology tools. For these and other reasons, an improved standard is needed.

SUMMARY OF THE INVENTION

In accordance with the principles of the present invention, a calibration standard for use in calibrating semiconductor metrology tools is disclosed.

Embodiments of the invention include a calibration standard having a calibration substrate. A surface of the substrate has a calibration layer formed thereon. A protective layer is then formed over the calibration layer to prevent the deterioration of the underlying calibration layer. The calibration layer and protective layer are formed having thicknesses on the order of thicknesses in actual semiconductor devices to precise tolerances permitting their use as effective calibration standards.

The invention also includes a method for forming a calibration standard for semiconductor metrology tools. Such method comprises providing a substrate having a surface with an rms surface roughness of less than about 1.0 Å. The surface is cleaned and then a calibration layer is formed thereon. The calibration layer is formed having a target thickness of about the same thickness as a layer to be measured on an actual device. A protective layer is formed over the calibration layer to a thickness of about the same as a corresponding layer on the actual device. The protective layer serves, among other things, to protect the calibration layer from deterioration.

These and other aspects of the present invention are described in greater detail in the detailed description of the drawings set forth hereinbelow.

BRIEF DESCRIPTION OF THE DRAWINGS

The following detailed description will be more readily understood in conjunction with the accompanying drawings, in which:

FIG. 1 is a cross-sectional view of a semiconductor surface having a calibration layer and protective layer of the present invention formed thereon.

FIG. 2 is a flow diagram providing details of one embodiment of forming a standard in accordance with the principles of the present invention.

It is to be understood that, in the drawings, like reference numerals designate like structural elements. Also, it is understood that the depictions in the Figures are not necessarily to scale.

DETAILED DESCRIPTION OF THE DRAWINGS

The present invention has been particularly shown and described with respect to certain embodiments and specific features thereof. The embodiments set forth hereinbelow are to be taken as illustrative rather than limiting. It should be readily apparent to those of ordinary skill in the art that various changes and modifications in form and detail may be made without departing from the spirit and scope of the invention.

The following detailed description describes various embodiments of calibration standards and methods of fabrication.

FIG. 1 depicts a calibration standard 100 for semiconductor metrology tools. Such a standard 100 includes a semiconductor wafer (also, referred to herein as a "wafer") 101 having a surface 101a. Formed on the surface is a calibration layer 102 and an overlying protective layer 103.

In one preferred embodiment, the surface 101a of such wafers 101 has a root mean squared (rms) surface roughness of less than about 1.0 Å. In other embodiments, wafers 101 having rms surface roughnesses in the range of about 0.5 Å to about 1.0 Å are used. The rms roughness of a surface is usually measured using a scanning type microscope (e.g. an atomic force microscope) and calculated using the equation:

$$R_{rms} = \sqrt{\frac{\sum (Z_i - Z_{ave})^2}{N}}$$

where $Z_i$ is the measured height on a point of the surface with respect to a reference plane, $Z_{ave}$ is the average of $Z_i$ over N data points collected from the surface.

Such wafers 101 are commonly constructed of silicon (Si) or gallium arsenide (GaAs) materials, but, as is known to persons having ordinary skill in the art, many other substrate materials, including those comprised of other semiconductor materials or doped semiconductor materials, can be used. In one embodiment, an eight-inch silicon wafer fabricated using epitaxy techniques can be used. Such epitaxial wafers are available from Sumitomo SITIX Silicon, Inc., Fremont, Calif., USA. Although epitaxial wafers are frequently the most suitable, the method of manufacture used to construct the wafer is not critical to the practice of the invention.

The surface of the wafer is then "cleaned" to remove unwanted residues. Typical example residues include, but are not limited to, metal and oxide residues remaining on the wafer surface. Such residues can be removed using commonly known procedures designed for such cleaning purposes. One example of a satisfactory process for cleaning the surface of epitaxial wafers has been demonstrated using the following process flow, using a DNS fC820L wet sink, manufactured by Dai Nippon Screen Electronics, Sunnyvale, Calif., USA:

(1) The wafer is rinsed with de-ionized $H_2O$ (DI) for about 60 s at about 25° C.

(2) A first semiconductor cleaning (SC1) is conducted (using, for example, a mixture of $H_2O_2$, HCl and $NH_4OH$, and DI in a volume ratio of about 1:1:1:5) to clean the wafer for about 100 s at about 50 C.

(3) The wafer is rinsed with DI for about 100 s at about 25° C.

(4) A second semiconductor cleaning (SC2) is conducted (using, for example, a mixture of $H_2O_2$, HCl and DI in a volume ratio of about 1:1:5) to clean the wafer for about 100 s at about 50° C.

(5) The wafer is again rinsed in DI for about 100 s at about 25° C.

(6) The wafer is then dried using an isopropanyl alcohol dry cycle.

Among the uses for the standards described herein is the calibration of metrology tools used to accurately measure layer thicknesses of fabricated semiconductor structures. In order for such calibration standards to be effective calibration tools, it is important that calibration layers of the calibration standards be formed to a thickness at or very near the thickness of the layer to be measured. Upon cleaning the surface of the wafer 101, a calibration layer 102 is formed on a surface 101a of the wafer 100. This layer 102 is formed to a thickness that is on the order of the thickness of a desired thickness of a layer to be measured on an actual fabricated device. In one such embodiment, the calibration layer 102 is formed having a thickness that is on the order of thickness of a gate electrode (i.e. the target thickness) used in an actual device. In such an embodiment, the calibration layer 102 is a gate calibration layer and can have thicknesses on the order of about 50–200 Å thick. In such cases, the gate calibration layer should be formed to a thickness within the ITRS guidelines of about 4% of the desired target thickness. In a preferred embodiment, the tolerance is within about 1–2% of the desired thickness (target thickness). In another embodiment, the gate calibration layer is an ultra-thin layer of material which can be used to calibrate metrology tools used to measure ultra-thin gate layers in semiconductor devices. Such ultra-thin gate calibration layers are typically constructed of silicon dioxide layers about 5–50 Å thick. In preferred embodiments, the ultra-thin gate calibration layers are formed to thicknesses of about 5–30 Å thick. In accordance with the ITRS guideline, it is desirable to form ultra-thin calibration layers having thickness tolerances on the order of about ±4%. Again, preferred embodiments have ultra-thin calibration layers wherein the thickness tolerances are on the order of about ±1–2% of the desired thickness of the actual gate layer.

In one example, silicon dioxide ($SiO_2$) calibration layers 102 can be used. Such layers can be formed by a variety of methods. In one example, using a silicon wafer as a substrate, $SiO_2$ calibration layers 102 can be grown using thermal oxidation methods known to those having ordinary skill in the art. In another approach, calibration layers 102 can be grown using atomic layer deposition (ALD). Also, RTCVD (Rapid Thermal Chemical Vapor Deposition) can be used to form a $SiO_2$ calibration layers 102. Such methods are not intended to be limiting, but rather illustrative in nature. As such, many other methods and materials can be used to form calibration layers 102.

One embodiment used for growing an ultra-thin silicon dioxide ($SiO_2$) layer uses a conventional furnace-based thermal oxidation process which can be summarized as follows:

(1) position a desired number of cleaned wafers in a furnace;

(2) seal the furnace to prevent the exchange of gasses between furnace chamber and outside environment;

(3) fill the rest of the furnace space with a predetermined number of "dummy wafers" to enhance thermal controllability and stability in the furnace;

(4) evacuate the furnace chamber and supply $N_2$ gas (this is useful for removing oxygen and water moisture from the chamber);

(5) maintain an oxygen partial pressure in the chamber of about 0.2 mTorr by constantly purging the furnace with a $N_2/O_2$ gas mixture;

(6) raise the temperature of the furnace at a rate of 600° C./hour to about 700° C. with constant oxygen partial pressure;

(7) maintain the furnace at about 700° C. for 20 minutes with constant oxygen partial pressure;

(8) cool the furnace at a rate of about 300° C./hour until room temperature is reached, while maintaining constant oxygen partial pressure; and (9) stop gas flow and remove the wafers.

The $SiO_2$ calibration layer thus obtained is 10–13 Å thick. However, the $SiO_2$ thickness can vary at each location within the chamber. But, the thickness of the $SiO_2$ layer is thought to be constant for each location within the furnace chamber.

In one example embodiment, the gate layer of a CMOS device is 10 Å thick. Therefore, an embodiment of a suitable standard will have a calibration layer 102 formed to a thickness of about 10 Å thick (the target thickness) with a tolerance of about ±4%. In this embodiment, the tolerance for the calibration layer is about 0.4 Å.

Other materials can be used to form useful calibration layers. For example, suitable calibration layers can be formed using a variety of gate layer materials including, but not limited to, silicon carbide, silicon oxynitride, silicon nitride, zirconium dioxide, hafnium dioxide, aluminum oxides, tantalum oxide, hafnium silicate, and zirconium silicate.

The thickness of the newly formed calibration layer 102 has to be accurately measured after film growth. Such measurement should be carried out within 20 minutes after the wafers are extracted from the furnace, otherwise the accuracy of the measurement will be reduced due to MAC absorption. In order to obtain measurements of satisfactory accuracy, other factors also should be considered in order to ensure a high degree of measurement accuracy. Some of these factors are:

(1) Possible thickness non-uniformity of the calibration layers within each wafer.

(2) Random measurement error due to fluctuations in environmental conditions, such as temperature.

(3) Systematic error of the measurement equipment.

Errors due to factor (1) are usually resolved by carrying out measurements at selected reference locations (e.g. center of the wafers). Thus, the most reliable standards use measurements taken near the center of wafers. The problem of random measurement error (factor (2)) is addressed by using statistical principles. For example, if thickness measurements are taken over a large enough sample size, the accuracy of such measurements can be improved. In practical cases, average thicknesses are computed using from about 30–50 measurements obtained from the same reference location. Factor (3) type errors can be addressed by comparing measurement results obtained by the measurement tool with measurement results for the same wafers obtained using other analytical techniques such as SIMS and TEM. This comparison process is completed prior to the actual measurements of the calibration standards.

Very soon after formation and measurement of the calibration layer 102, a protective layer 103 is formed over the calibration layer 102. Such protective layers 103 are formed to a desired thickness that is of substantially similar thickness to an analogous layer on the actual semiconductor structures being measured. Thus, for embodiments measuring gate layers, the material overlying the gate layer is a gate electrode material commonly formed of an amorphous silicon material on the order of about 1000 Å thick. Thus, the protective layer 103 should be about 1000 Å thick. In one embodiment, a typical metrology standard has an ultra-thin calibration layer (e.g., 5–50 Å thick) that corresponds to a gate layer and a protective layer of appropriate thickness (e.g., 1000 Å thick or other appropriate thickness) corresponding to a gate electrode. The range of protective layer 103 thicknesses can be quite great and are simply analogous to their counterparts on the actual semiconductor structures being measured. Such a protective layer 103 reduces the deterioration of the underlying calibration layer 102. As with the semiconductor structures being measured, the protective layers 103 are formed of materials that are different from, and substantially un-reactive with, the underlying calibration layer 102. The protective layer 103 is commonly formed having a much greater thickness than the calibration layer 102. One advantage of such thick protective layers 103 is that they need not be formed to quite the same high degree of precision as the thin calibration layers 102. In one embodiment, the protective layer 103 is formed of amorphous silicon having a thickness of about 1000 Å. However, as is known to those having ordinary skill in the art, other thicknesses ranging from about 200 Å to about 3000 Å thick can also be formed. The actual thickness of the protective layer 103 corresponds to an analogous layer in the actual device being fabricated. Such protective layers 103 are formed to the aforementioned thicknesses to a tolerance of about ±1–2%. It is important that the thickness of the protective layer 103 be chosen such that the environmental deterioration (and resulting increase in layer thickness) of the protective layer falls within the allowable thickness tolerance for the protective layer 103 (i.e. about 1–2% of thickness). In addition to amorphous silicon, other materials can be used to form satisfactory protective layers 103. Such materials include, but are not limited to, poly-silicon and silicon germanium (SiGe) layers. Suitable thicknesses for such layers range from about 50 Å to about 2000 Å, with thicknesses of about 500 Å to about 2000 Å being most preferred.

In the case of amorphous silicon protective layers 103, such amorphous silicon layers can be formed using a wide variety of methods known to persons having ordinary skill in the art. Examples include, but are not limited to, sputter deposition, CVD, RTCVD, TEOS, as well as other methods.

In addition to the few examples cited above, other materials can also be used to form such protective layers. Examples include, but are not limited to, oxides of transition metals and silicon nitride. A few other representative examples include $HfO_2$, $ZrO_2$, $Ta_2O_5$, $Al_2O_3$, $HfSiO_2$ and $ZrSiO_2$. Because such materials are used in thinner layers in actual devices, protective layers 103 formed of these materials can be formed having lesser thicknesses (e.g., in the range of about 50–200 Å) than the previously described amorphous silicon protective layers. For example, suitable $HfO_2$ protective layers can be formed having thicknesses in the range of about 50–100 Å to a tolerance of about ±1–2%. As with the protective layers 103 discussed above, the thicknesses reflect the thickness of an associated layer thickness on the actual devices.

Once the protective layer 103 is formed, the calibration layer 102 and the protective layer 103 are measured again. These final measurements define the standard and can be used for future calibrations of metrology tools. The final measurement procedure is effectively the same as that for measuring the calibration layer, except in this case care must be taken to optimize the performance of the measurement equipment so that it can resolve the thicknesses of both the calibration and protective layers accurately.

Thus, an embodiment of forming such a standard can be summarized as follows. A substrate with a surface with a rms surface roughness of less than about 1.0 Å is provided (Step 201). This substrate is cleaned (Step 203). A calibration layer, having a thickness of about the same thickness as a layer to be measured, is forming on the surface of the substrate (Step 205). This calibration layer is measured (Step 207). A protective layer is forming over the calibration layer to protect the calibration layer from deterioration (Step 209). The thicknesses of the calibration layer and the protective layer are measured (Step 211).

The present invention has been particularly shown and described with respect to certain preferred embodiments and specific features thereof. However, it should be noted that the above-described embodiments are intended to describe the principles of the invention, not limit its scope. Therefore, as is readily apparent to those of ordinary skill in the art, various changes and modifications in form and detail may be made without departing from the spirit and scope of the invention as set forth in the appended claims. Other embodiments and variations to the depicted embodiments will be apparent to those skilled in the art and may be made without departing from the spirit and scope of the invention as defined in the following claims. In particular, the inventors contemplate that other materials can be used to form the calibration and protective layers in accordance with the principles of the present invention. Further, reference in the claims to an element in the singular is not intended to mean "one and only one" unless explicitly stated, but rather, "one or more". Furthermore, the embodiments illustratively disclosed herein can be practiced without any element which is not specifically disclosed herein.

We claim:

1. A method for forming a calibration standard for semiconductor metrology tools, the method comprising:

providing a substrate having a surface with a rms surface roughness of less than about 1.0 Å;

forming on the surface of the substrate a calibration layer having a thickness of about the same thickness as a layer to be measured; and forming over the calibration layer a protective layer to protect the calibration layer from deterioration.

2. The method of claim 1, wherein the method includes cleaning the surface of the substrate prior to forming the calibration layer.

3. The method of claim 1, further including measuring the thickness of the calibration layer after it is formed and measuring the thickness of the calibration layer and the thickness of the protective layer after the protective layer is formed.

4. The method of claim 1, wherein forming the calibration layer comprises forming the calibration layer having a thickness of in the range of about 5 Å to about 200 Å.

5. The method of claim 4, wherein forming the calibration layer comprises forming the calibration layer having a thickness of in the range of about 5 Å to about 50 Å.

6. The method of claim 5, wherein forming a calibration layer comprises forming the calibration layer to a thickness of in the range of about 5 Å to about 50 Å and having a thickness tolerance of less than about 4% of layer to be measured.

7. The method of claim 4, wherein forming a calibration layer comprises forming the calibration layer using a material selected from among silicon dioxide, zirconium dioxide, hafnium dioxide, aluminum oxide, tantalum oxide, hafnium silicate, and zirconium silicate.

8. The method of claim 6, wherein forming a calibration layer comprises forming the calibration layer using a material selected from among silicon dioxide, zirconium dioxide, hafnium dioxide, aluminum oxide, tantalum oxide, hafnium silicate, and zirconium silicate.

9. The method of claim 1, wherein forming the protective layer comprises forming the protective layer having a thickness of in the range of about 50 Å to about 1000 Å.

10. The method of claim 9, wherein forming the protective layer comprises forming the protective layer of a material consisting of one of $HfO_2$, $ZrO_2$, $Ta_2O_5$, $Al_2O_3$, $HfSiO_3$, and $ZrSiO_2$ and having a thickness of in the range of 50 Å to about 100 Å thick and having a thickness tolerance of less than about 2% of a desired thickness for the protective layer.

11. The method of claim 9, wherein the protective layer is formed having a thickness tolerance on the order of about 1% to about 2% of a desired thickness for the protective layer.

12. The method of claim 9, wherein forming the protective layer comprises forming the protective layer of a material selected from among amorphous silicon, polysilicon, and SiGe and having a thickness of in the range of 50 Å to about 2000 Å thick and having a thickness tolerance of about 4% of a desired thickness for the protective layer.

13. The method of claim 12, wherein the protective layer is formed having a thickness tolerance in the range of about 1% to about 2% of a desired thickness for the protective layer.

* * * * *